United States Patent [19]

Asai et al.

[11] Patent Number: 5,736,770
[45] Date of Patent: Apr. 7, 1998

[54] SEMICONDUCTOR DEVICE WITH CONDUCTIVE CONNECTING LAYER AND ABUTTING INSULATOR SECTION MADE OF OXIDE OF SAME MATERIAL

[75] Inventors: Akiyoshi Asai, Aichi; Nobuyuki Ohya; Mitsutaka Katada, both of Kariya, all of Japan

[73] Assignee: Nippondenso Co., Ltd., Kariya, Japan

[21] Appl. No.: 248,002

[22] Filed: May 24, 1994

[30] Foreign Application Priority Data

May 25, 1993 [JP] Japan ................... 5-122757

[51] Int. Cl.⁶ .................. H01L 29/78; H01L 23/48; H01L 27/02; H01L 29/34
[52] U.S. Cl. .................. 257/382; 257/384; 257/377; 257/508; 257/754; 257/755; 257/759; 257/760; 257/641; 257/649
[58] Field of Search ................... 257/382, 384, 257/377, 508, 751, 754, 755, 758, 760, 767, 649, 640, 641

[56] References Cited

U.S. PATENT DOCUMENTS

| 4,844,776 | 7/1989 | Lee et al. | 437/43 |
| 4,873,557 | 10/1989 | Kita | 257/384 |
| 4,922,311 | 5/1990 | Lee et al. | 257/382 |
| 5,162,881 | 11/1992 | Ohya | 257/758 |
| 5,164,814 | 11/1992 | Okumura | 257/758 |
| 5,182,619 | 1/1993 | Pfiester | 257/382 |
| 5,198,378 | 3/1993 | Rodder et al. | 257/384 |
| 5,241,203 | 8/1993 | Hsu et al. | 257/382 |
| 5,296,729 | 3/1994 | Yamanaka et al. | 257/382 |
| 5,384,485 | 1/1995 | Nishida et al. | 257/382 |
| 5,396,094 | 3/1995 | Matsuo | 257/767 |
| 5,500,558 | 3/1996 | Hayashide | 257/758 |

FOREIGN PATENT DOCUMENTS

| 54-22782 | 2/1979 | Japan . |
| 61-170066 | 7/1986 | Japan . |
| 62-291176 | 12/1987 | Japan . |
| 3-74848 | 3/1991 | Japan . |
| 3232238 | 10/1991 | Japan . |
| 4 51528 | 2/1992 | Japan . |

*Primary Examiner*—Tom Thomas
*Assistant Examiner*—Alexander Oscar Williams
*Attorney, Agent, or Firm*—Cushman, Darby & Cushman IP Group of Pillsbury Madison & Sutro LLP

[57] ABSTRACT

A semiconductor device comprising: a semiconductor substrate; a diffused region extending from the surface and to the inside of the semiconductor substrate; a first insulating layer formed on the semiconductor substrate and having a contact hole located through which the diffused region is exposed; a first conductor layer formed on a portion of the first insulating layer and connected so the diffused region through the first contact hole; and an insulator section made of an oxide of the substance of the first conductor layer and formed on another portion of the first insulating layer to surround the first conductor layer.

29 Claims, 9 Drawing Sheets

SEMICONDUCTOR DEVICE WITH CONDUCTIVE CONNECTING LAYER AND ABUTTING INSULATOR SECTION MADE OF OXIDE OF SAME MATERIAL

BACKGROUND OF THE INVENTION

1. Field of the Invention

The present invention relates to a semiconductor device, particularly to an insulated gate field effect transistor (IGFET) having a fine structure advantageous for providing a highly integrated, high speed, small power consuming device.

The present invention also relates to a process of producing such a semiconductor device.

2. Description of the Related Art

It has been generally recognized that reducing the area of the source/drain diffused region of a metal oxide semiconductor field effect transistor (MOSFET) is advantageous not only because the device occupies less area but also because the parasitic capacitance of the source/drain diffused region is reduced, which improves the device performance including high speed and low power consumption.

The area of a source/drain diffused region, however, is determined by the diameter of the contact holes necessary for connecting the source and drain regions to conductor wiring running above these regions, and by the necessary allowance for possible misalignment of the contact holes relative to the gate electrode and the device-isolation insulating layer. This fact limits the possible reduction in the area of the source/drain diffused region.

To reduce the area of source/drain diffused region free from the above-mentioned alignment limitation, measures are proposed in Japanese Unexamined Patent Publication (Kokai) Nos. 61-170066 and 62-291176.

The structure proposed by Japanese Unexamined Patent Publication (Kokai) No. 62-291176 is shown by FIG. 1, which includes a silicon substrate 1, a device-isolation insulating layer 2 for isolating the shown device from other not-shown devices formed on the silicon substrate 1, a gate insulating layer 3, a gate electrode 4, a pair of source/drain diffused regions 5, an interlaminar insulating film 6, a pair of metal conductors 7 forming part of wiring of the shown device, an insulating layer 8 provided on the side walls of the gate electrode 4.

In the structure shown in FIG. 1, polycrystalline silicon layers 9 are directly connected to the source and drain diffused regions 5 at one end thereof through a pair of contact holes each provided between the side wall of the gate electrode 4 and one of the device-isolation insulating layers 2. The polycrystalline silicon layers 9 extend to the upper surface of the device-isolation insulating layers 2, and are connected to the metal conductors 7 at upper surfaces of the portions thereof lying above the device-isolation insulating layers 2. This structure enables the area of source/drain diffused region to be reduced free from the alignment limitation.

The conventional structure shown in FIG. 1 is typically produced through the process steps shown in FIGS. 2(a) to 2(d).

Referring to FIG. 2(a), known process steps are carried out to form, on a silicon substrate 1, a device-isolation insulating layer 2, a gate insulating layer 3, a gate electrode 4, and a gate side wall insulating layer 8. The gate electrode 4 contains a doped impurity such as As, P, or the like.

Referring to FIG. 2(b), a polycrystalline silicon layer 9 is formed over the above-formed members 2, 3, 4, and 8, and is then heat-treated to cause As, P or other impurity to diffuse from the gate electrode 4 into the polycrystalline silicon layer 9 in the portion 9A located above the gate electrode 4, i.e., the polycrystalline silicon layer 9 in the portion 9A is doped with As, P or other impurity.

Referring to FIG. 2(c), the polycrystalline silicon layer 9 in the doped portion 9A is then removed by selective etching to expose the top surface of the gate electrode 4. As-ion implantation and heat treatment are then performed to reduce the electrical resistivity of the polycrystalline silicon layer 9 and also to form source and drain diffused layers 5 containing the impurity in a high concentration.

Referring to FIG. 2(d), usual photo-etching is carried out to pattern the polycrystalline silicon layer 9 so as to form a pair of right and left segments of the polycrystalline silicon layer 9 each extending from a source or a drain layer 5 onto the device-isolation insulating layer 2 and terminating on the device-isolation insulating layer 2. An interlaminar insulating film 6 is then formed to cover the entire free surface. Contact holes 6A are opened through the interlaminar insulating film 6. Metal conductor layers 7 are formed so as to fill the contact holes 6A and extend from the upper surface of the right and left segments of the polycrystalline silicon layer 9 located within the contact holes 6A, onto the interlaminar insulating film 6.

This conventional technology advantageously provides self-alignment because the polycrystalline silicon layer 9 is divided at the position of the gate electrode 4 into a pair of separate leads made of the polycrystalline silicon to connect the source and drain diffused layers 5 to the respective metal conductor layers 7, by utilizing the fact that the etching rate of the polycrystalline silicon layer 9 is partially increased in the portion to which As, P or other impurity is doped.

However, there is a problem that the etching rate of the polycrystalline silicon layer 9 is fluctuated by the fluctuation in the concentration of the doped impurity in the polycrystalline silicon layer 9. This involves, on one hand, insufficient etching and leaves unetched bits which cause short-circuiting between two segments of the polycrystalline silicon layer 9 or between the polycrystalline silicon layer 9 connected to the source and drain diffused layers and the gate electrode 4 and, on the other hand, over etching causing disconnection in the polycrystalline silicon layer 9. Thus, it is conventionally difficult to ensure stable manufacture of ICs integrating a great number, from several tens of hundreds up to several hundreds of thousands, of electric elements.

Moreover, the gate electrode 4 must be doped with As, P or other impurity to be later transferred to the polycrystalline silicon layer 9. However, doping of the gate electrode 4 at a high concentration makes the underlying gate insulating layer 3 less reliable and the gate electrode 4 itself less processable.

There is also another problem that the interlaminar insulating film 6 located on the polycrystalline silicon layer 9 is usually made of BPSG (borophosphosilicate glass), from which B and/or P diffuses into the polycrystalline silicon layer 9 to thereby fluctuate the electrical resistance of the polycrystalline silicon layer 9.

SUMMARY OF THE INVENTION

To solve the first problem, an object of the present invention is to provide a semiconductor device having a structure which facilitates stable production by eliminating the conventional fluctuation involving insufficient and/or excessive etchings causing short circuiting and disconnection.

To solve the second problem, another object of the present invention is to provide a semiconductor device having a structure free from the fluctuation of the electrical resistance of the polycrystalline silicon layer providing conductor leads to the source and drain regions.

To achieve an object according to the present invention, there is provided a semiconductor device comprising:
a semiconductor substrate;
a diffused region extending from the surface and to the inside of the semiconductor substrate;
a first insulating layer formed on the semiconductor substrate and having a contact hole located through which the diffused region is exposed;
a first conductor layer formed on a portion of the first insulating layer and connected to the diffused region through the first contact hole; and
an insulator section made of an oxide of the substance of the first conductor layer and formed on another portion of the first insulating layer to surround the first conductor layer.

According to the present invention, there is also provided a semiconductor device comprising:
a semiconductor substrate;
a diffused layer formed from the surface to the inside of the semiconductor substrate;
a first insulating layer formed on the semiconductor substrate and having a contact hole located on the diffused layer;
a conductor layer formed on the first insulating layer and connected to the diffused layer through the contact hole;
a diffusion-preventing film covering the conductor layer;
a second insulating layer doped with an impurity and formed on the diffusion-preventing film; and
the diffusion-preventing film preventing diffusion of impurities from the second insulating layer to the conductor layer.

The diffusion-preventing film is preferably a nitride film.

The diffusion-preventing film consists of a high melting point, silicide composite.

The conductor layer may consist of a polycrystalline semiconductor substance.

DESCRIPTION OF THE PREFERRED EMBODIMENTS

Example 1

Figure 1:
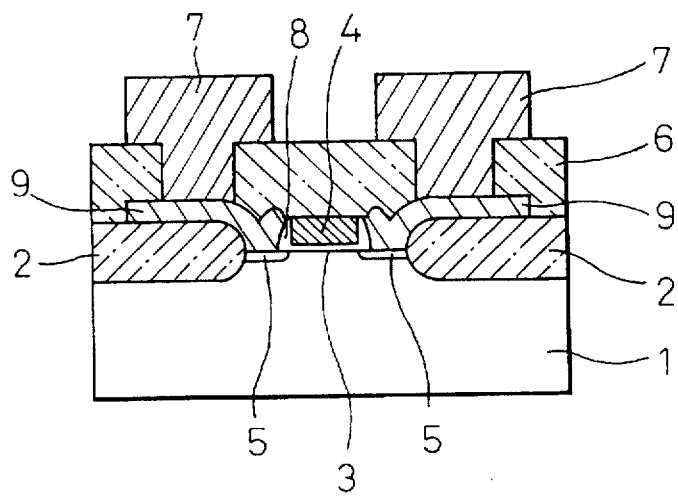
FIG. 1 shows a conventional insulated gate field effect transistor (IGFET), in a sectional view.
Figure 2A:
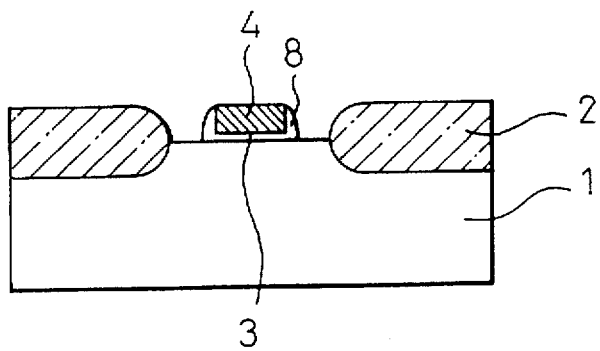
FIGS. 2(a) to 2(d) show the process steps for producing the conventional IGFET shown in FIG. 1, in sectional views.
Figure 2B:
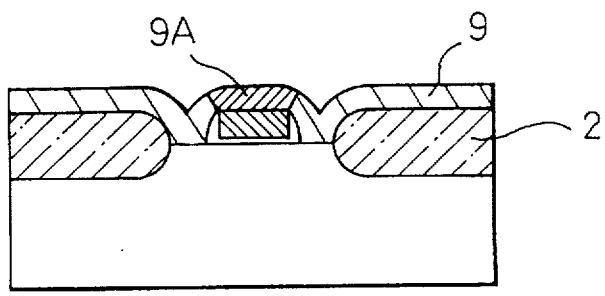
Figure 2C:
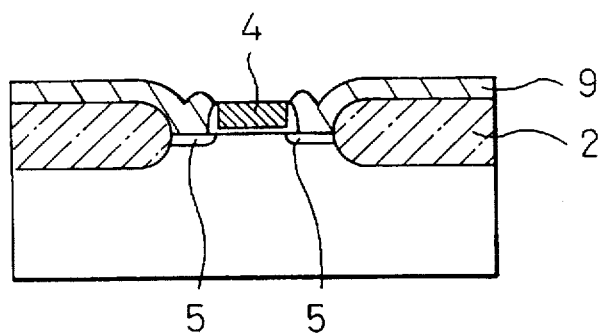
Figure 2D:
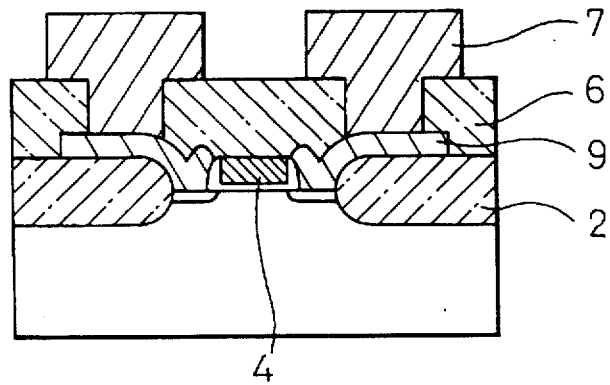
Figure 3:
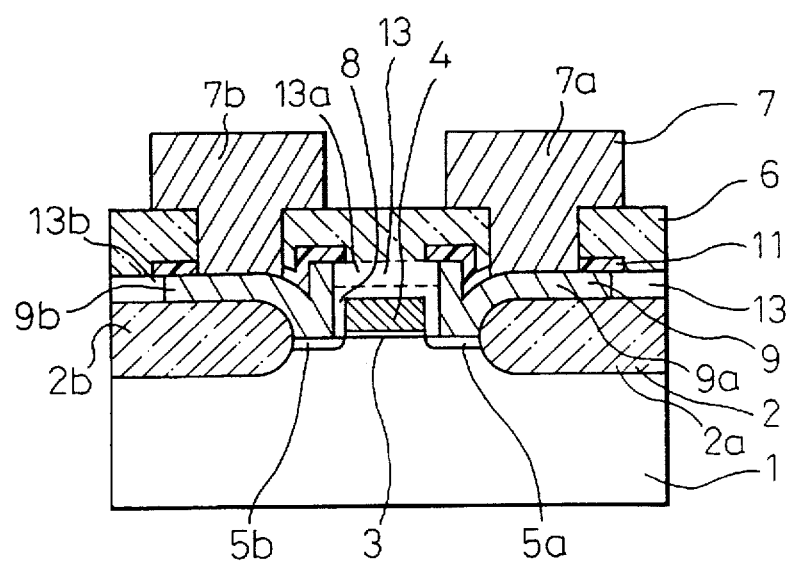
FIG. 3 shows a preferred embodiment of the IGFET according to the present invention, in a sectional view.

FIG. 3 shows a preferred embodiment of the IGFET according to the present invention.

The IGFET shown in FIG. 3 comprises:
a semiconductor substrate (1);
a first diffused region (5a) formed from the surface of and to the inside of the semiconductor substrate (1);
a second diffused region (5b) formed from the surface of and to the inside of the semiconductor substrate (1);
an electrode (4) made of a conducting substance and formed, via a first insulator section (3), on the semiconductor substrate (1) in the portion located between the first diffused region (5a) and the second diffused region (5b);
a first insulating layer (2a) formed on the semiconductor substrate (1) defining a first contact hole through which the first diffused region (5a) is exposed;
a second insulating layer (2b) formed on the semiconductor substrate (1) defining a second contact hole through which the second diffused region (5b) is exposed;
a first conductor layer (9a) formed on a portion of the first insulating layer (2a) and connected to the first diffused region (5a) through the first contact hole;
a second conductor layer (9b) formed on a portion of the second insulating layer (2b) and connected to the second diffused region (5b) through the second contact hole;
a second insulator section (13a) made of an oxide of the same substance as that composing the first conductor layer (9a) and the second conductor layer (9b) and formed on the electrode (4);
a third insulating layer (6) formed on the first conductor layer (9a), the second conductor layer (9b) and the second insulator section (13a) and having a third contact hole communicating, from above, with the first conductor layer (9a) and a fourth contact hole communicating, from above, with the second conductor layer (9b);
a third conductor layer (7a) formed on the third insulating layer (6) and connected to the first conductor layer (9a) through the third contact hole; and
a fourth conductor layer (7b) formed on the third insulating layer (6) and connected to the second conductor layer (9b) through the fourth contact hole.

FIGS. 4 to 9 show a preferred embodiment of the process steps for producing the IGFET shown in FIG. 3.

Figure 4:
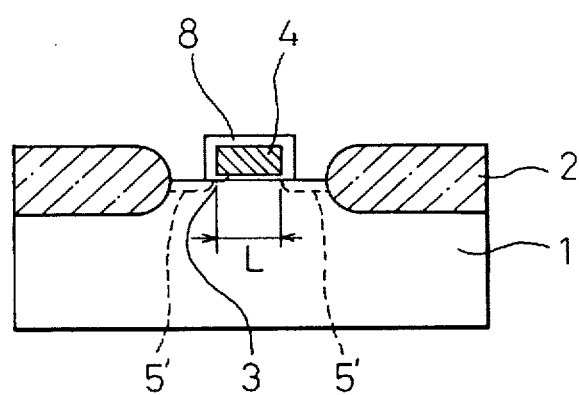
FIGS. 4 to 9 show a preferred embodiment of the process steps for producing the IGFET shown in FIG. 3 according to the present invention, in sectional views.
Figure 8:
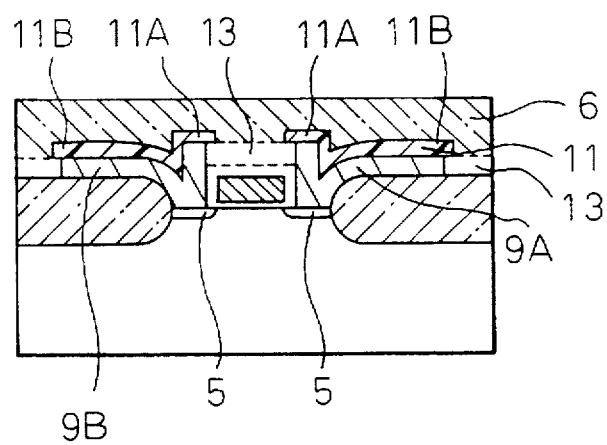

Referring to FIG. 4, a conventional process steps are carried out to form, on a silicon substrate 1, a device-isolation insulating layer 2, a gate insulating layer 3, and a gate electrode 4, to leave the silicon substrate 1 exposed in the portions 5' for providing the source and drain diffused regions 5 in a later step (FIG. 8).

An insulating layer 8 is formed, for example, by thermal oxidation at 875° C. for 30 min in water vapor to form a 150 nm thick oxide layer over the surface of the gate electrode 4. During this process, the silicon substrate 1 is also oxidized to form an about 40 nm thick oxide layer thereon because the silicon is less oxidizable than the metal of the gate electrode 4. The less thick oxide layer formed on the silicon substrate 1 is then removed by wet etching using HF or the like to expose the silicon substrate 1. Consequently, the insulating layer 8 having a reduced thickness of about 100 nm covers only the top and side surfaces of the gate electrode 4.

At this stage, assuming the gate electrode has an as-patterned width of L μm, the width becomes about (L−0.15) μm after the insulating film 8 is formed. Here, the insulating film 8 may have a thickness "a" which provides sufficient electrical insulation between the gate electrode 4 and a connecting layer (a polycrystalline silicon layer 9) to be formed later. The thickness "a", however, is desirably thick in order to reduce a parasitic capacitance between the gate electrode 4 and the source and drain electrodes 5. The thickness "a" is also related to the alignment allowance when patterning the polycrystalline silicon layer 9. Therefore, the thickness "a" of the insulating layer 8 is determined totally based on the device performance and the processing requirement.

Advantageously, a laminated film such as a polycrystalline silicon/silicon nitride film or a polycrystalline silicon/silicon nitride film/silicon nitride film is advantageously deposited on the gate electrode 4 and patterned, in order to prevent oxidation of the gate electrode 4 during later oxidation steps and/or to provide a thick insulating film selectively on the gate electrode 4.

Figure 5:
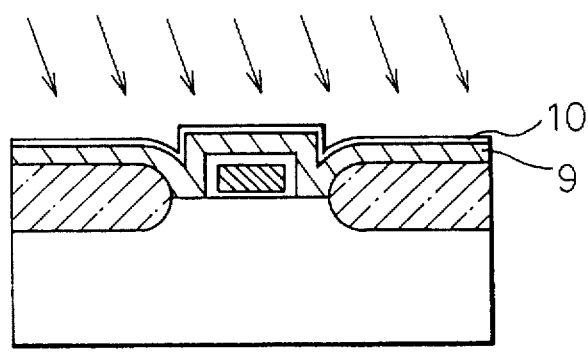

Referring to FIG. 5, a connecting layer such as polycrystalline silicon layer 9 is formed entirely on the substrate by a CVD method and the surface thereof is then oxidized to form a silicon oxide layer 10 having a thickness of about 20 nm. The connecting layer may be composed of other material such as amorphous silicon or a high melting point metal that is electroconductive and can be transformed to an insulating material when oxidized. Thereafter, a source/drain impurity is introduced into the polycrystalline silicon layer 9 by ion implantation. The polycrystalline silicon layer 9 formed by CVD has a uniform thickness and a profile accurately corresponding to that of the underlying layers.

Figure 6:
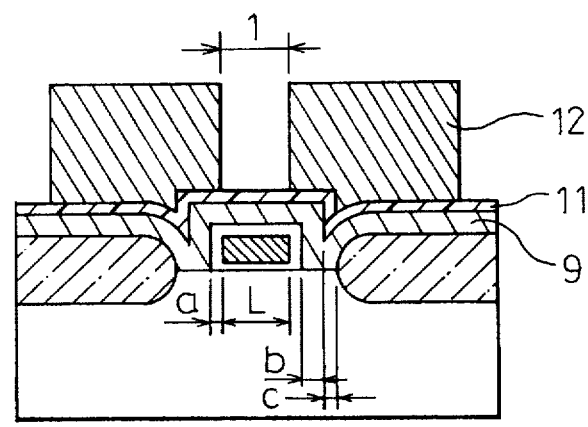

Referring to FIG. 6, after removing the silicon oxide layer 10 by etching, an oxidation-resistant film 11 such as a silicon nitride film is formed by CVD entirely on the substrate.

Before forming the silicon nitride film 11, the polycrystalline silicon layer may oxidized again to form a oxide layer as thin as several tens of nm, or instead, the silicon oxide layer 10 may be kept unremoved.

Subsequently, a resist layer 12 is patterned by photolithography to form an opening above the gate electrode 4.

Figure 7:
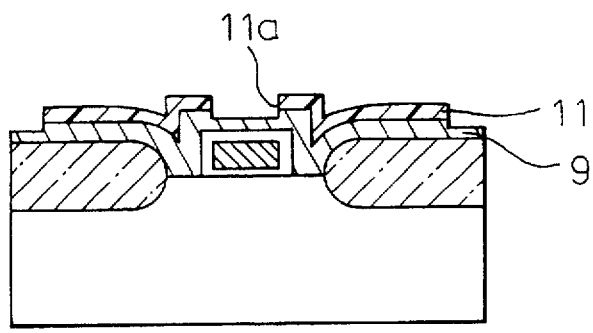

Referring to FIG. 7, the silicon nitride film 11, in the portion exposed through the above-formed opening, is removed by etching to form an opening therethrough and the resist layer 12 is then removed. This etching is performed in a manner such that part of, or a substantial portion of, the underlying polycrystalline silicon layer 9 is also removed.

Supposing the polycrystalline silicon layer 9 is removed to about half the thickness thereof, a subsequent oxidation operation oxidizes the remaining half of the polycrystalline silicon layer 9 to form a silicon oxide film 13 having a thickness substantially equal to that of the polycrystalline silicon layer 9 in the portion covered by the silicon nitride film 11 and not subjected to the oxidation. This provides good planeness because there is no substantial step between the silicon oxide film 13 and the unoxidized polycrystalline silicon layer 9 covered by the silicon nitride film 11. This also facilitates the processing of layers to be formed later.

It is further advantageous that a major part of the polycrystalline silicon layer 9 is removed by etching prior to the oxidation operation, so as to significantly reduce the thickness of the polycrystalline silicon layer 9, thereby reducing the amount of material to be oxidized, so that the process becomes high controllable and the number of heat cycles is also reduced. In this case, however, it becomes difficult to ensure the above-mentioned good planeness. Therefore, there may be selection between whether the most important matter is the planeness or the process controllability obtained by reducing the material amount of the polycrystalline silicon layer 9 to be oxidized.

Referring to FIG. 8, an interlaminar insulating film 6 such as a BPSG film is formed entirely on the substrate and is then reflowed by a heat treatment in water vapor. During this heat treatment, the polycrystalline silicon layer 9, in the portion left after etching and exposed above the gate electrode, is fully oxidized to form a silicon oxide film 13, so that the polycrystalline silicon layer 9 forms the source/drain lead electrodes 9A and 9B. This heat treatment also causes the impurity introduced into the polycrystalline silicon layer 9 by ion implantation to diffuse into the silicon substrate 1, thereby forming source and drain diffused regions 5, and the impurity is also activated to reduce the resistivity of the polycrystalline silicon 9.

The polycrystalline silicon layer 9 in the portion exposed above the gate electrode 4 is isotropicaly oxidized to form a silicon oxide film 13 which intrudes slightly into the polycrystalline silicon layer 9 under the silicon nitride film 11. Similarly, the polycrystalline silicon layer 9 in the right and left ends is oxidized to form a silicon oxide film 13 which intrudes slightly into the polycrystalline silicon layer 9 under the silicon nitride film 11. This consequently forms protruding ends 11A and 11B of the silicon nitride film 11 over the gate electrode 4 and the right and left ends of the polycrystalline silicon layer 9.

The condition of this heat treatment should be determined by considering the following four aspects: the reflowing of the interlaminar insulating layer 6; the oxidation of the polycrystalline silicon layer 9 in the exposed portion; the formation of the source and drain regions 5; and the activation of the impurity contained in the polycrystalline silicon layer 9. From this point of view, the heat treatment may be carried out at a temperature of from 800° C. to 950° C. for a time interval of from 30 min to 1 hour, for example.

Instead of simultaneously effecting the four aspects, some of these aspects may by effected separately from the other ones. For example, instead of simultaneously effecting the reflowing of the interlaminar insulating film 6 and the oxidation of the polycrystalline silicon layer 9, after etching the silicon nitride film 11, a heat treatment is carried out to oxidize the polycrystalline silicon layer 9 and thereafter the interlaminar insulating film 6 is formed. In another case, instead of forming source and drain diffused regions 5 by this heat treatment, before forming the polycrystalline silicon layer 9, an impurity of the second conductivity type is introduced into the silicon substrate by ion implantation to form source and drain diffused regions 5, which may include a heat treatment for the diffusion of the introduced impurity. In another case, a heat treatment may be carried out to simultaneously effect oxidization of the polycrystalline silicon layer 9 and formation of the source and drain diffused regions 5, prior to a heat treatment for reflow of the interlaminar insulating film 6.

Figure 9:
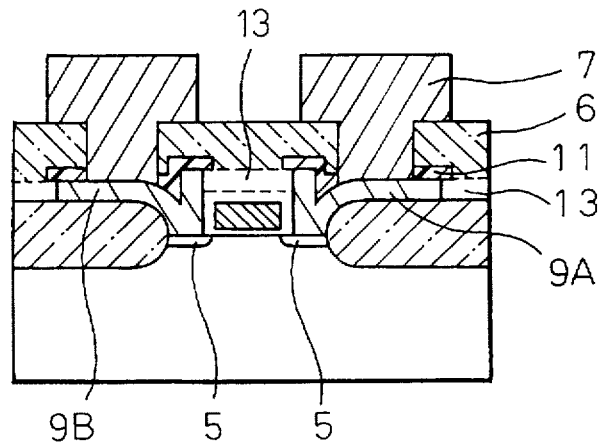

Referring to FIG. 9, conventional processing is carried out to open contact holes through the interlaminar insulating film 6 and the silicon nitride film 11 and to form metal conductor layers 7 connected to the polycrystalline silicon layer 9.

According to an embodiment described in Example 1, a polycrystalline silicon layer formed on the gate electrode is separated into two parts for the source and drain sides, respectively, to ensure electrical isolation of the polycrystalline silicon layer 9. This provides an insulated gate field effect transistor (IGFET) which can be stably produced.

Moreover, a silicon nitride film is provided between a polycrystalline silicon layer forming leads from the source/drain regions and an overlying BPSG interlaminar insulating film, so that impurities such as B and P are prevented from diffusing from the BPSG film to the polycrystalline silicon layer. This prevents fluctuation in the resistivity due to diffusion of impurities into the polycrystalline silicon layer.

Although Example 1 describes an IGFET of a single conductivity type for simplicity, IGFETs of different conductivity types can, of course, be formed in a single silicon substrate by utilizing the process described in Example 1 and based on the conventional process of producing a complementary IGFET.

In this Example, misalignment which occurs during patterning a resist for patterning the silicon nitride layer 11 shown in FIG. 6, is corrected in the following manner.

An alignment allowance can be defined as a sum "a+b", in which "a" is the lateral thickness of the insulating film 8 covering the side wall of the gate electrode 4 and "b" is the thickness of the connecting layer 9. This can be explained with reference to FIGS. 10(a) to 10(d).

FIGS. 10(a) to 10(d) all illustrate a section in a process stage in which the polycrystalline silicon layer 9 is formed entirely on the silicon substrate 1, a photoresist 12 is applied on the polycrystalline silicon layer 9 and is then patterned to form an opening therein above the gate electrode 4.

Figure 10A:
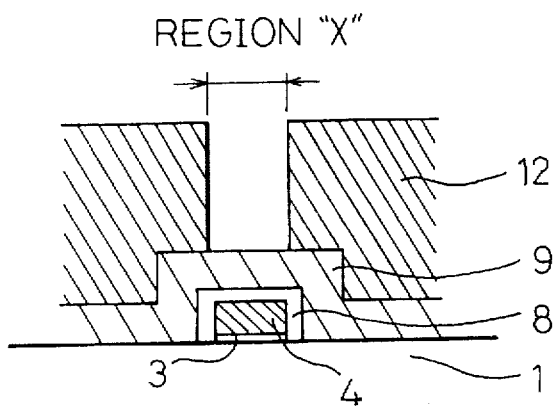
FIGS. 10(a) to 10(d) illustrate the relationship between the misalignment and the alignment allowance during forming an opening above a gate electrode, in sectional views.

FIG. 10(a) shows a section obtained when the resist layer 12 is patterned without misalignment, in which the opening "X" of the photoresist 12 generally has a center axis aligned with the center axis of the gate electrode 4.

Figure 10B:
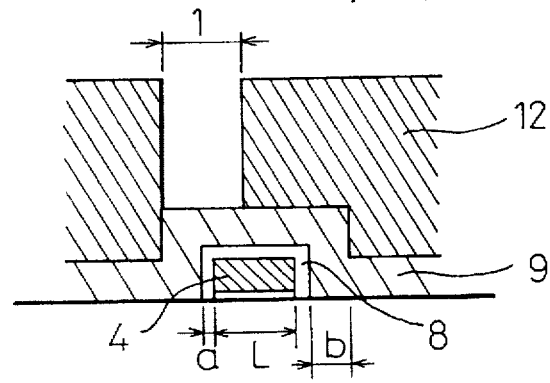

FIG. 10(b) shows a section obtained when the resist layer 12 is patterned with a maximum misalignment within a misalignment allowance.

In cases shown in FIGS. 10(a) and 10(b), etching of the polycrystalline silicon layer 9 does not cause undesired etching or exposure of the silicon substrate 1.

Figure 10C:
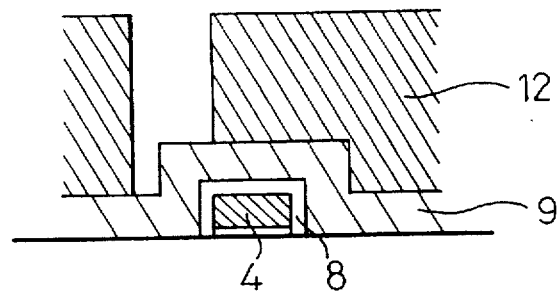

FIG. 10(c) shows a section obtained when the resist layer 12 is patterned with a further greater misalignment exceeding a misalignment allowance. In this case, etching of the polycrystalline silicon layer 9 would cause the silicon substrate 1 to be exposed in the portion next to the side wall of the gate electrode 4 that provides source and drain diffused regions, and further, would cause etching of the silicon substrate 1.

Referring to FIG. 10(b), the maximum misalignment allowance "d" can be expressed in terms of the width "L" of the gate electrode 4, the diameter "X"(=1) of the opening of the resist layer 12, the lateral thickness "a" of the insulating film 8 on the side wall of the gate electrode 4, and the thickness "b" of the polycrystalline silicon layer 9, by the following formula:

$$d=a+b+(L-1)/2, \; 1>b$$

The misalignment allowance is generally determined by considering parameters such as the dimension of misalignment, the fluctuation occurring during patterning the resist layer, and the dimensional change including fluctuation relative to the resist occurring during etching. For example, with a misalignment "d" of 0.3 μm and a width "L" equal to "1", the sum "a+b" may be determined as 0.3 μm, "a" being the lateral thickness of the insulating layer 8 on the side wall of the gate electrode 4 and "b" being the thickness of the polycrystalline silicon layer 9.

When a production process can effect a fine working just requiring a working allowance of 0.05 μm or more, dimensions may be determined to satisfy the formula: a+b+(L−1)/2>0.05 μm. Usually, this formula can be satisfied merely by setting the thickness "b" of the polycrystalline silicon layer 9 to a value of 0.05 μm or more, because the "L" and "1" have values about equal to each other and near a minimum workable dimension and because the lateral thickness "a" of the insulating layer 8 on the side wall of the gate electrode 4 must be several tens of nm or more in order to ensure electrical insulation between the gate electrode 4 and the polycrystalline silicon layer 9.

Thus, the working stability is improved by imparting a great value to the sum, "a+b", of the lateral thickness "a" of the gate electrode side wall insulating layer 8 and the thickness "b" of the polycrystalline silicon layer 9, and thereby providing an increased misalignment allowance favoring easy working of the polycrystalline silicon layer 9 by photo-etching.

Figure 10D:
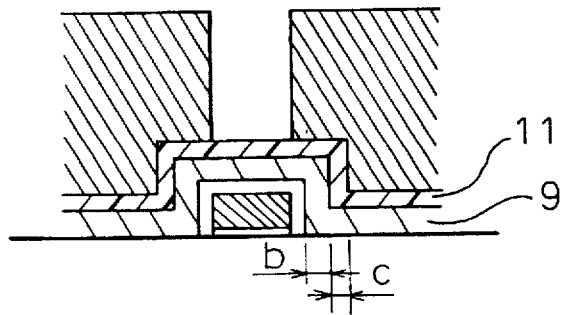

Referring to FIG. 10(d), an oxidation-resistant film 11 is formed on the polycrystalline silicon layer 9 to provide a further increased misalignment allowance defined by a sum, "a+b+c", of the sum "b+c" of the thickness "b" of the polycrystalline silicon layer 9 and the thickness "c" of the oxidation-resistant film 11 and the lateral thickness of the gate electrode side wall insulating layer 8, so that the polycrystalline silicon layer 9 is further stably worked by photo-etching. This brings about an increased degree of freedom for setting the final thickness of the polycrystalline silicon layer 9. After working the polycrystalline silicon layer 9, any unnecessary oxidation-resistant film 11 may be removed.

In this Example, when the thickness "b" of the polycrystalline silicon layer 9 is equal to 200 nm, the thickness of the silicon nitride film 11 is equal to 100 nm, and the as-patterned width "L" of the gate electrode 4 is equal to "1", the misalignment allowance "d" can be given by:

$$\begin{aligned} d &= a+b+c+(L-1)/2 \\ &= 0.1+0.2+0.1+((L-0.15)-1)/2 \\ &= 0.325 \, \mu m. \end{aligned}$$

This value of "d" provides a sufficient misalignment allowance to carry out stable working or patterning. The thicknesses of the polycrystalline silicon layer 9 and the silicon nitride film 11 are determined by a misalignment allowance required in a specific process step.

The present invention is also advantageously applied in forming IGFETs of different conductivity types in a single silicon substrate by a process simpler than the conventional process. This will be described in detail by way of the following Example 2.

Example 2

Figure 11:
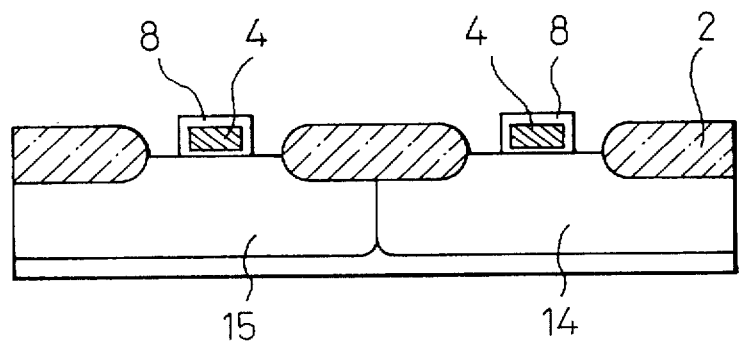
FIGS. 11 to 15 show another preferred embodiment of the process steps for producing the IGFET shown in FIG. 3 according to the present invention, in sectional views.

The structure shown in FIG. 11 is formed by the same process as described by referring to FIG. 4. The shown two insulated gate field effect transistors are formed in an N-region 14 and a P-region 15 defined in a silicon substrate 1, respectively. FIG. 11 also shows gate electrodes 4, insulating layers 8, and device-isolation insulating layers 2.

Figure 12:
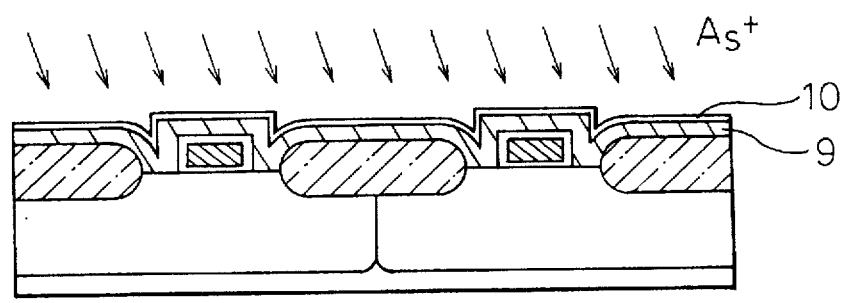

Referring to FIG. 12, a polycrystalline silicon layer 9 is formed entirely on the silicon substrate 1 and the surface thereof is then oxidized to form an about 20 nm thick, silicon oxide film 10. Then, ion implantation is carried out to introduce As as an N-type source/drain impurity over the entire surface through the silicon nitride film 10 at an acceleration energy of about 40 KeV or less so that the As penetrates to a depth of about 100 nm or less.

Figure 13:
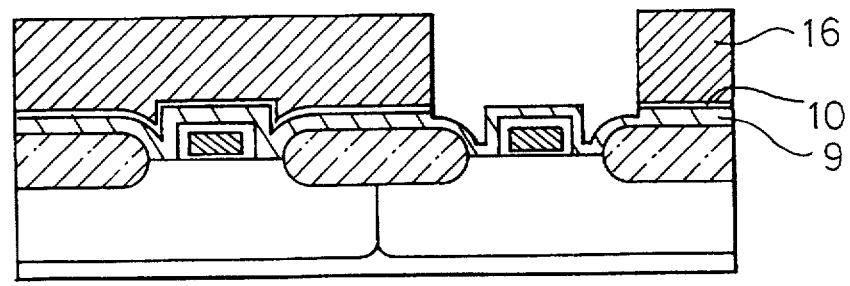

Referring to FIG. 13, after forming a photoresist layer 16, a photolithography process is then carried out to pattern the photoresist layer 16 so that the photoresist layer 16 is removed only in the portion in which a P-type region will be formed in a later process stage, such as a source/drain region of a P-type IGFET or a contact for biasing of the P-type region 15. The silicon nitride film 10 may be removed prior to carrying out the photolithography process. By using the photoresist polycrystalline silicon layer 9, in the exposed region, are etched to a depth of about 100 nm to remove the polycrystalline silicon layer 9 only in the surface portion containing As.

Figure 14:
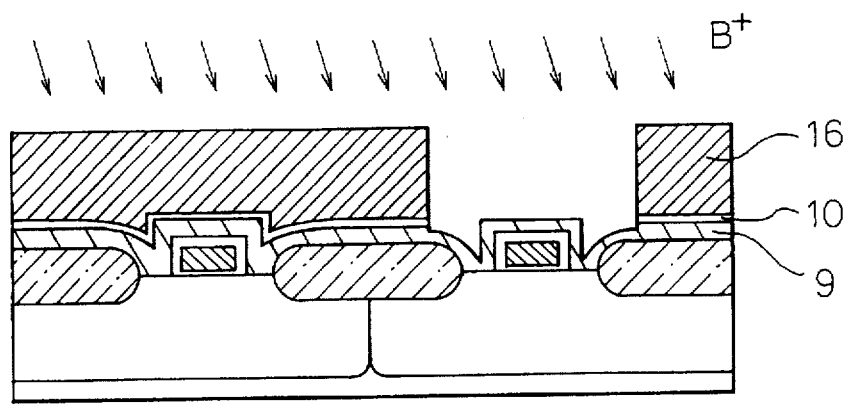
Figure 15:
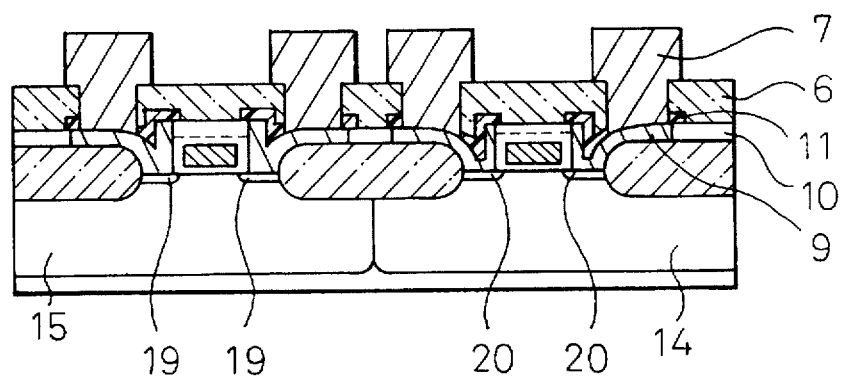

Referring to FIG. 14, by again using the photoresist layer 16 as a mask, ion implantation is carried out at an acceleration energy of about 20 KeV to introduce a P-type impurity such as B into the polycrystalline silicon layer 9 selectively in the portion left in the exposed region. Then, after removing the photoresist layer 16, the process steps described in Example 1 by referring to FIGS. 6 to 9 are repeated to form a structure shown in FIG. 15.

This provides a pair of N-type source/drain diffused regions 19 and a pair of P-type source/drain regions 20 formed in P- and N-type regions, respectively, in the same and one silicon substrate 1, to complete IGFETs of different conductivity types. The impurity regions such as the N- and P-type source/drain regions are formed by a single run of photolithography process. This is an advantageous simplification of processing by the present invention in comparison with the conventional process, in which photolithography process must be carried out two times in order to form those impurity regions.

If the structure obtained by Example 2 according to the present invention were produced by a conventional process of producing an IGFET having a conventional structure in which source/drain diffused regions are formed by ion implantation of an impurity directly into a silicon substrate, the process would have to include etching of the silicon substrate causing a damage to occur in the silicon substrate, and thereby, causing problems such as current leakage, etc. In contrast, the structure and process described in Example 2 according to the present invention only requires etching of a lead provided by the polycrystalline silicon layer 9 and does not damage the silicon substrate.

Although Example 2 first carries out the ion implantation of As (N-type impurity) into the entire surface, ion implantation of B (P-type impurity) may instead be first carried out followed by a selective ion implantation of an N-type impurity in a manner as described in Example 2.

Example 3

Referring to FIGS. 16 to 20, a further embodiment of the present invention will be described in detail.

Figure 16:
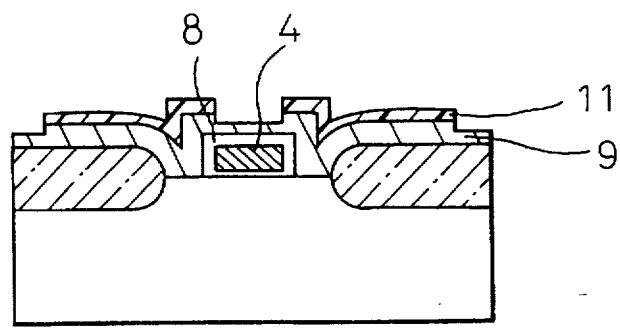
FIGS. 16 to 20 show a further embodiment of the process steps for producing an IGFET according to the present invention, in sectional views.

The structure shown in FIG. 16 is formed by the process steps described in Example 1 by referring to FIGS. 4 to 7. In this Example, a gate electrode 4 is a polycide electrode composed of a polycrystalline silicon/WSi$_x$ laminate film, which is not shown in the drawing.

Figure 17:
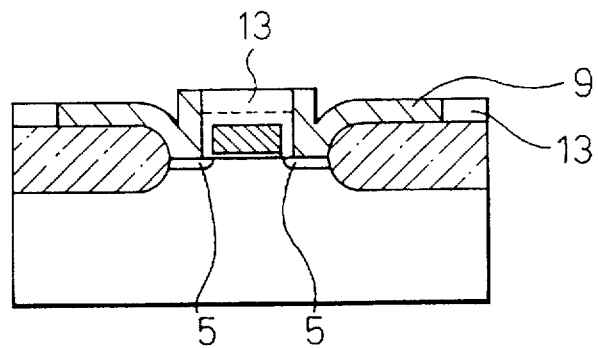

Referring to FIG. 17, the exposed portion of the polycrystalline silicon layer 9 is entirely oxidized to form a silicon oxide film 13, and then, the silicon nitride film 11 is removed by wet etching with hot phosphoric acid.

Figure 18:
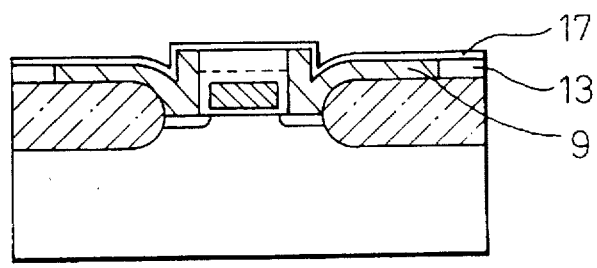

Referring to FIG. 18, an about 40 nm thick layer 17 of a high melting point metal, such as titanium, is formed on the entire surface.

Figure 19:
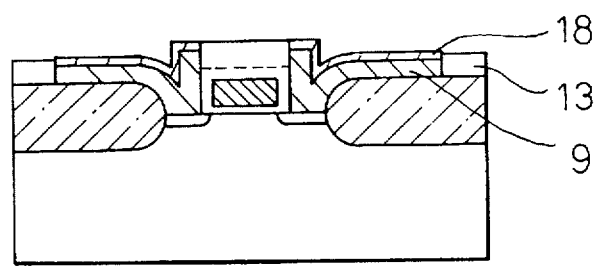
Figure 20:
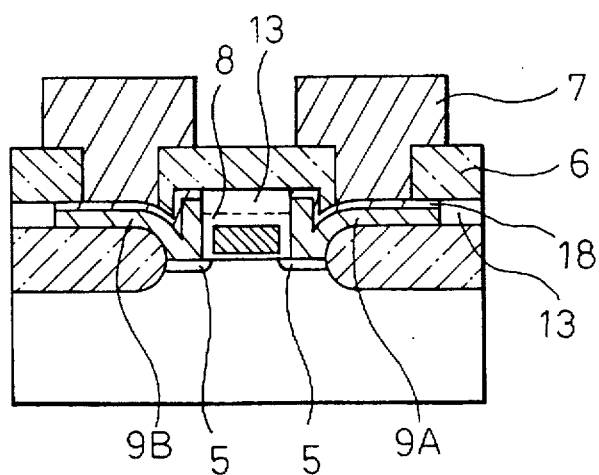

Referring to FIG. 19, heat treatment is carried out at about 600° C. in an inert gas atmosphere to cause the titanium 17 react with the silicon 9 on the surface of the polycrystalline silicon layer 9 to form a titanium silicide layer 18, and subsequently, treatment with a solution selectively etching titanium, such as a mixture of hydrogen peroxide and ammonia water, is carried out to remove any unreacted titanium remaining on the silicon oxide film 13, so that the titanium silicide layer 18 is formed only on the polycrystalline silicon layer 9 in a self-aligning manner. Thereafter, heat treatment is carried out at a temperature of 800 ° C. or higher in an inert gas atmosphere to reduce the electric resistivity of the titanium silicide layer 18, and as shown in FIG. 20, an interlaminar insulating film 6 made of BPSG, contact holes, and metal conductor layers 7 are formed.

According to this Example, the electric resistivity of the polycrystalline silicon layer 9 can be reduced by the overlying titanium silicide layer 18, thereby reducing the parasitic capacity of the source/drain regions 5 of an IGFET, which is advantageous in producing a high speed semiconductor device.

In the conventional device structure, converting the surface of the souce/drain regions formed in a silicon substrate into a silicide causes a problem of that the junction leakage is increased in the source/drain regions. In contrast, this Example according to the present invention converts the surface of the polycrystalline silicon layer 9 and does not affect the silicon substrate.

As described herein above, the first aspect of present invention ensures electrical isolation of conductor layers, and thereby, provides a semiconductor device which can be stably produced with a high reproducibility. The second aspect of the present invention eliminates diffusion of impurities from a second insulating layer to a first conductor layer, and thereby, provides a semiconductor device free from the fluctuation in resistivity due to impurity diffusion into the first conductor layer.

We claim:

1. A semiconductor device comprising:

a semiconductor substrate;

a diffused region extending from a surface of said semiconductor substrate to inside said semiconductor substrate;

a first insulating layer formed on said semiconductor substrate and having a first contact hole exposing said diffused region;

a first conductor layer formed on a portion of said first insulating layer and directly contacting said diffused region through said first contact hole; and an insulator section made of an oxide of the substance of said first conductor layer and formed on another portion of said first insulating layer to surround said first conductor layer.

2. A semiconductor device according to claim 1, further comprising:

a second insulating layer formed on and in direct contact with each of said first conductor layer and said insulator section, and having a second contact hole exposing said first conductor layer; and a second conductor layer formed on said second insulating layer and directly contacting said first conductor layer through said second contact hole.

3. A semiconductor device comprising:

a semiconductor substrate;

a first diffused region formed from a surface of said semiconductor substrate to inside said semiconductor substrate;

a second diffused region formed from said surface of said semiconductor substrate to inside said semiconductor substrate;

a first insulator section formed on said semiconductor substrate between said first diffused region and said second diffused region;

an electrode made of a conductive substance and formed on a top surface of said first insulator section, said top surface being opposite a lower surface of said first insulator section which is on said semiconductor substrate;

a first insulating layer formed on said semiconductor substrate defining a first contact hole exposing said first diffused region;

a second insulating layer formed on said semiconductor substrate defining a second contact hole exposing said second diffused region;

a first conductor layer formed on a portion of said first insulating layer and directly contacting said first diffused region through said first contact hole;

a second conductor layer formed on a portion of said second insulating layer and directly contacting said second diffused region through said second contact hole;

a second insulator section made of an oxide of the same substance of each of said first conductor layer and said second conductor layer and formed on said electrode, said second insulator section facing a first surface of said electrode which is opposite a second surface of said electrode facing said semiconductor substrate, and being between said first and second conductor layers;

a third insulating layer formed on said first conductor layer, said second conductor layer and said second insulator section and having a third contact hole exposing, from above, said first conductor layer and a fourth contact hole exposing, from above, said second conductor layer;

a third conductor layer formed on said third insulating layer and directly contacting said first conductor layer through said third contact hole; and a fourth conductor layer formed on said third insulating layer and directly contacting said second conductor layer through said fourth contact hole.

4. A semiconductor device according to claim 3, further comprising a third insulator section disposed on said electrode and under said third insulating layer.

5. A semiconductor device comprising:

a semiconductor substrate:

a diffused layer formed from a surface of said semiconductor substrate to inside said semiconductor substrate;

a first insulator section formed on said semiconductor substrate;

an electrode made of a conductive substance and formed on a top surface of said first insulator section, said top surface being opposite a lower surface of said first insulator section which is on said semiconductor substrate;

a first insulating layer formed on said semiconductor substrate and having a first contact hole exposing said diffused layer;

a first conductor layer formed on a portion of said first insulating layer and in direct contact with said diffused region through said first contact hole;

a second insulator section made of an oxide of the same substance of said first conductor layer and formed on said electrode, said second insulator section facing a first surface of said electrode which is opposite a second surface of said electrode facing said semiconductor substrate, and being between said first and second conductor layers;

a second insulating layer formed on said first conductor layer and having a second contact hole exposing, from above, said first conductor layer; and a second conductor layer formed on said second insulating layer and in direct contact with said first conductor layer through said second contact hole.

6. A semiconductor device according to any one of claim 3, wherein said conductor layer consists of a polycrystalline semiconductor substance.

7. A semiconductor device according to any one of claim 3, wherein said diffused layer is the source or drain of a MIS transistor.

8. A semiconductor device comprising:

a semiconductor substrate;

a diffused region extending from a surface of said semiconductor substrate to inside said semiconductor substrate;

a first insulating layer formed on said semiconductor substrate and having a first contact hole exposing said diffused region;

a first conductor layer formed on a portion of said first insulating layer and directly contacting said diffused region through said first contact hole;

an insulator section made of an oxide of the substance of said first conductor layer and formed on another portion of said first insulating layer to surround said first conductor layer;

a diffusion-preventing film covering said conductor layer;

a second insulating layer doped with an impurity and formed on said diffusion-preventing film, said diffusion-preventing film preventing diffusion of impurities from said second insulating layer to said conductor layer.

9. A semiconductor device according to claim 8, wherein said diffusion-preventing film is a nitride film.

10. A semiconductor device according to claim 8, wherein said diffusion-preventing film consists of a silicide composite having a high melting point.

11. A semiconductor device comprising:

a semiconductor substrate;

a first diffused region formed from a surface of said semiconductor substrate to inside said semiconductor substrate;

a second diffused region formed from said surface of said semiconductor substrate to inside said semiconductor substrate;

a first insulator section formed on said semiconductor substrate between said first diffused region and said second diffused region;

an electrode made of a conductive substance and formed on a top surface of said first insulator section, said top surface being opposite a lower surface of said first insulator section which is on said semiconductor substrate;

a first insulating layer formed on said semiconductor substrate defining a first contact hole exposing said first diffused region;

a second insulating layer formed on said semiconductor substrate defining a second contact hole exposing said second diffused region;

a first conductor layer formed on a portion of said first insulating layer and directly contacting said first diffused region through said first contact hole;

a second conductor layer formed on a portion of said second insulating layer and directly contacting said second diffused region through said second contact hole;

a second insulator section made of an oxide of the same substance of each of said first conductor layer and said second conductor layer and formed on said electrode, said second insulator section facing a first surface of said electrode which is opposite a second surface of said electrode facing said semiconductor substrate, and being between said first and second conductor layers;

a third insulating layer formed on said first conductor layer, said second conductor layer, and said second insulator section and having a third contact hole exposing, from above, said first conductor layer and a fourth contact hole exposing, from above, said second conductor layer;

a third conductor layer formed on said third insulating layer and directly contacting said first conductor layer through said third contact hole;

a fourth conductor layer formed on said third insulating layer and directly contacting said second conductor layer through said fourth contact hole;

a diffusion-preventing film covering each of said first and second conductor layers, said third insulating layer being doped with an impurity and formed on said diffusion-preventing film, said diffusion-preventing film preventing diffusion of impurities from said third insulating layer to each of said first and second conductor layers.

12. A semiconductor device according to claim 11, wherein said diffusion-preventing film is a nitride film.

13. A semiconductor device according to claim 11, wherein said diffusion-preventing film consists of a silicide composite having a high melting point.

14. A semiconductor device comprising:

a semiconductor substrate;

a diffused layer formed from a surface of said semiconductor substrate to inside said semiconductor substrate;

a first insulator section formed on said semiconductor substrate;

an electrode made of a conductive substance and formed on a top surface of said first insulator section, said top surface being opposite a lower surface of said first insulator section which is on said semiconductor substrate;

a first insulating layer formed on said semiconductor substrate and having a first contact hole exposing said diffused layer;

a first conductor layer formed on a portion of said first insulating layer in direct contact with said diffused region through said first contact hole;

a second insulator section made of an oxide of the same substance of said first conductor layer and formed on said electrode, said second insulator section facing a first surface of said electrode which is opposite a second surface of said electrode facing said semiconductor substrate, and being between said first and second conductor layers;

a second insulating layer formed on said first conductor layer and having a second contact hole exposing, from above, said first conductor layer;

a second conductor layer formed on said second insulating layer and in direct contact with said first conductor layer through said second contact hole; and a diffusion-preventing film covering each of said first and second conductor layers, said second insulating layer being doped with an impurity and formed on said diffusion-preventing film, said diffusion-preventing film preventing diffusion of impurities from said second insulating layer to each of said first and second conductor layers.

15. A semiconductor device according to claim 14, wherein said diffusion-preventing film is a nitride film.

16. A semiconductor device according to claim 14, wherein said diffusion-preventing film consists of a silicide composite having a high melting point.

17. A semiconductor device according to claim 8, further comprising an interface between said first conductor layer and said insulator section, said interface lying in a plane and being between a first surface of said diffusion-preventing film and said surface of said semiconductor substrate, said first surface facing said first conductor layer, said diffusion-preventing film overlapping and extending beyond said interface in each of two opposing directions generally perpendicular to said plane.

18. A semiconductor device according to claim 17, wherein said interface is substantially orthogonal to said surface of said semiconductor substrate.

19. A semiconductor device according to claim 11, further comprising a first interface between said first conductor layer and said second insulator section and a second interface between said second conductor layer and said second insulator section, said first interface lying in a first plane and being between a first surface of said diffusion-preventing film and said surface of said semiconductor substrate, said first surface facing said first conductor layer, said diffusion-preventing film overlapping and extending beyond said first interface in each of two opposing directions generally perpendicular to said first plane, said second interface lying in a second plane and being between a second surface of said diffusion-preventing film and said surface of said semiconductor substrate, said first surface facing said first conductor layer, said diffusion-preventing film overlapping and extending beyond said second interface in each of two opposing directions generally perpendicular to said second plane.

20. A semiconductor device according to claim 19, wherein each of said first and second interfaces is substantially orthogonal to said surface of said semiconductor substrate.

21. A semiconductor device according to claim 14, further comprising an interface between said first conductor layer and said second insulator section, said interface lying in a plane and being between a first surface of said diffusion-preventing film and said surface of said semiconductor substrate, said first surface facing said first conductor layer, said diffusion-preventing film overlapping and extending beyond said interface in each of two opposing directions generally perpendicular to said plane.

22. A semiconductor device according to claim 21, wherein each of said first and second interfaces is substantially orthogonal to said surface of said semiconductor substrate.

23. A semiconductor device according to claim 1, further comprising an oxidation-resistant film covering said first conductor layer.

24. A semiconductor device according to claim 1, wherein said insulator section is positioned at a first distance from said first contact hole, said first distance being larger than a second distance from said first contact hole to said first conductor layer.

25. A semiconductor device according to claim 3, further comprising an oxidation-resistant film covering each of said first and second conductor layers.

26. A semiconductor device according to claim 5, further comprising an oxidation-resistant film covering each of said first and second conductor layers.

27. A semiconductor device according to claim 8, wherein said diffusion-preventing film comprises an oxidation-resistant film.

28. A semiconductor device according to claim 11, wherein said diffusion-preventing film comprises an oxidation-resistant film.

29. A semiconductor device according to claim 14, wherein said diffusion-preventing film comprises an oxidation-resistant film.

* * * * *